United States Patent
Tallon

(10) Patent No.: US 6,784,138 B2
(45) Date of Patent: Aug. 31, 2004

(54) CRITICAL DOPING IN HIGH-$T_C$ SUPERCONDUCTORS FOR MAXIMAL FLUX PINNING AND CRITICAL CURRENTS

(75) Inventor: Jeffery Lewis Tallon, York Bay (NZ)

(73) Assignee: Industrial Research Limited, Lower Hutt (NZ)

(*) Notice: Subject to any disclaimer, the term of this patent is extended or adjusted under 35 U.S.C. 154(b) by 0 days.

(21) Appl. No.: 10/327,408

(22) Filed: Dec. 20, 2002

(65) Prior Publication Data

US 2003/0162666 A1 Aug. 28, 2003

Related U.S. Application Data

(63) Continuation of application No. 09/719,439, filed as application No. PCT/NZ99/00095 on Jun. 18, 1999, now abandoned.

(30) Foreign Application Priority Data

Jun. 18, 1998 (NZ) ............................................ 330728
Jan. 29, 1999 (NZ) ............................................ 333971

(51) Int. Cl.⁷ ........................ C04B 35/64; C04B 101/00
(52) U.S. Cl. ........................ 505/120; 505/121; 505/125; 505/230; 505/501; 505/742
(58) Field of Search ................................ 505/120, 121, 505/125, 230, 500, 501, 742

(56) References Cited

U.S. PATENT DOCUMENTS 5,776,862 A * 7/1998 Usami et al. ............... 505/125

OTHER PUBLICATIONS

Ihara et al "Cu1–xTlxBa2Ca3Cu4O12–y Superconductor with Tc of 126 K", Physica C, M2S–HTSC 1997.*
Shimoyama et al "Strong Flux Pinningup to liquid nitrogen temperature . . . ", Physica C, 281(1), 69–75, 1997.*
Shimoyama et al "Dramatically improved Flux Pinning Propertiesof heavily Pb–doped Bi2212 single crystals . . . ", Adv. Supercond. X, Proc. Int. Symp. Supecond., 10$^{th}$ (1998), vol. 1, 279–284. Meeting date Oct. 1997.*

* cited by examiner

Primary Examiner—Mark Kopec
(74) Attorney, Agent, or Firm—Dann, Dorfman, Herrell and Skillman, P.C.

(57) ABSTRACT

A method for maximising critical current density ($J_c$) of high temperature superconducting cuprate materials (HTSC) which comprises controlling the doping state or hole concentration of the materials to be higher than the doping state or hole concentration of the material that provides a maximum superconducting transition temperature ($T_c$), and to lie at about a value where the normal-state pseudogap reduces to a minimum. Jc is maximised1 at hole concentration p≈0.19. HTSC compounds are also claimed.

26 Claims, 6 Drawing Sheets

CRITICAL DOPING IN HIGH-$T_C$ SUPERCONDUCTORS FOR MAXIMAL FLUX PINNING AND CRITICAL CURRENTS

This application is a continuation of U.S. application Ser. No. 09/719,439, filed Mar. 27, 2001 abandoned as International Application No. PCT/NZ99/00095 filed Jun. 18, 1999.

FIELD OF THE INVENTION

The invention comprises a method for preparing a high temperature superconducting cuprate material (HTSC) to maximise the critical current density of the material, in which the doping state or hole concentration of the material is controlled so as to lie at about the point where the normal-state pseudogap reduces to a minimum.

BACKGROUND

Many High-$T_c$ Superconducting Cuprates (HTSC) are known to have superconducting transition temperatures, $T_c$ exceeding the temperature at which liquid nitrogen boils, 77 K. As such they have a potentially large number of applications ranging from power generation, distribution, transformation and control, to high-field magnets, motors, body scanners, telecommunication and electronics. $T_c$ values may be of the order of 93 K for example for $YBa_2Cu_3O_{7-\delta}$, 95K for example for $Bi_2Sr_2CaCu_2O_8$, 109 K for example for $Bi_2Sr_2Ca_2Cu_3O_{10}$, 120K for example for $TlBa_2Ca_2Cu_3O_{10}$ or as high as 134 K for $HgBa_2Ca_2Cu_3O_{10}$. For many of these applications such $T_c$ values alone do not guarantee the utility of these HTSC at 77K or higher temperatures. Often these applications require large critical current densities, $J_c$, in the presence of a magnetic field. Even if the grains of the HTSC are crystallographically aligned, otherwise known as textured, and well sintered together, as is commonly achieved in thin-films, such that weak links between the grains are removed, a high critical current in the presence of a magnetic field is not guaranteed. Such high currents are only achieved if there is strong flux pinning within the individual grains. A simple measure of the flux pinning contribution to $J_c$ is the product, $U_o\xi$, of the condensation energy, $U_o$, and the superconducting coherence length, $\xi$. An additional measure of the intrinsic ability of HTSC materials to support high critical currents in the presence of a magnetic field is the temperature-dependent irreversibility field, $H^*(T)$. For magnetic fields exceeding $H^*$ the magnetisation is reversible and hence dissipative while it is irreversible for fields less than $H^*$ and hence substantially non-dissipative. If for a given temperature $H^*$ is large then at that temperature the critical current density for fields $H<H^*$ may be high. Many models for the irreversibility field have $H^* \alpha \lambda_L^{-2}$ where $\lambda_L$ is the in-plane London penetration depth. Thus if $\lambda_L$ is minimised ($\lambda_{-2}$ maximised) then $H^*$ may be maximised.

HTSC have a fundamentally important feature that their properties vary with the concentration of doped electronic carriers. The carriers are electron holes, referred to in short as holes. The concentration of holes may be altered by chemical substitution or by changing the oxygen concentration. In general, the hole concentration may be increased by substituting a lower valency atom for a higher valency atom or by increasing the oxygen content. The hole concentration, p, may be decreased by substituting a higher valency atom for a lower valency atom or by decreasing the oxygen content. Thus in $La_2CuO_4$ which is an undoped insulator, the hole concentration is increased from zero by substituting $Sr^{2+}$ for the $La^{3+}$. In $YBa_2Cu_3O_7$ the hole concentration may be decreased by substituting $La^{3+}$ for $Ba^{2+}$ or by decreasing the oxygen content as in the formula $YBa_2Cu_3O_{7-\delta}$ where $\delta$ may be increased from 0 to 1. When $\delta=1$ this compound in an undoped insulator like $La_2CuO_4$. By increasing the hole concentration from the undoped insulating state the HTSC eventually becomes superconducting at low temperature. This (lower) threshold hole concentration is about p=0.05, for example. If the hole concentration is increased too high beyond an upper threshold then the HTSC material becomes a non-superconducting metal even at the lowest temperature. This upper threshold is about p=0.27. Between the lower and upper thresholds $T_c$ rises up smoothly from zero at the lower threshold to a maximum at about p=0.16 then falls smoothly back to zero at the upper threshold. The maximum $T_c$ value in this variation with hole concentration is $T_{c,max}$ and it occurs at a hole concentration frequently referred to as optimal doping. The variation in $T_c$ with hole concentration follows a nearly parabolic variation approximated by $T_c(p) = T_{c,max}[1-82.6(p-0.16^2)]$, so that as noted $T_c$ maximises at p≈0.16. At optimal doping the room temperature thermoelectric power takes the value $Q(290K)=+2$ $\mu V/K$ (Tallon et al, U.S. Pat. No. 5,619,141 which is incorporated herein by reference). When the hole concentration is less than optimal doping the HTSC material is referred to as underdoped and when it is greater than optimal doping it is referred to as overdoped. Optimal doping then is seen as the key doping state to which other doping states are referred. Prior to the present invention the usual criterion for optimising superconductivity in HTSC was to maximise $T_c$.

SUMMARY OF INVENTION

In broad terms in one aspect the invention comprises a method for preparing a high temperature superconducting cuprate material (HTSC) to maximise the critical current density ($J_c$) thereof, comprising the step of controlling the doping state or hole concentration of the material to be higher than the doping state or hole concentration of the material that provides a maximum superconducting transition temperature ($T_c$) to increase the critical current density of the material.

In broad terms in another aspect the invention comprises a high temperature superconducting cuprate material (HTSC) having a doping state or hole concentration higher than the doping state or hole concentration of the material for maximum superconducting transition temperature ($T_c$) and at about a value where the normal-state pseudogap for the material reduces to a minimum and which maximises the critical current density ($J_c$) of the material.

We have surprisingly found that the optimal doping for maximising $T_c$ is not the optimal doping for maximising flux pinning, $U_o$, $\lambda_L^{-2}$ or the critical current density $J_c$. We have found that JC, flux pinning, $U_o$, $\lambda_L^{-2}$ maximise at a higher doping state or hole concentration than that which maximises $T_c$ and at about the point where the normal-state pseudo-gap reduces to a minimum, particularly where the hole concentration $0.18 \leq p \leq 0.20$ and most particularly at about p=0.19 or p=0.19±0.005. We believe this is due to the presence, across the underdoped and slightly overdoped regions, of a correlated state that reduces low-energy spectral weight in the quasiparticle excitation spectrum. This reduction in spectral weight is referred to as the pseudogap and is sometimes mistakenly described as a spin gap. The pseudogap is manifested as a reduction in the normal-state entropy and susceptibility which strongly suppresses superconductivity and all measures thereof including $T_c$, condensation energy and superfluid density. The pseudogap energy, $E_g$, may be determined by fitting the normal state temperature dependence of the Knight shift, $K_s(T)$, to an equation $K_s(T)=K_o(1-\tan h^2(E_g/2kT)+K_c$ where $K_c$ is the chemical shift.

$E_g$ may alternatively be determined by fitting the normal-state temperature dependence of the entropy, $S(T)$ to an equation $S(T)/T=g_o[\tan h^2(E_g/2kT)]$, where $g_o$ is a constant.

Typically $E_g$ is found to decrease with increasing hole concentration, p. More sophisticated means of determining $E_g$ are known (see Tallon et al J. Phys. Chem. Solids 59, 2145 (1998) which is incorporated herein by reference) but the values of $E_g$ thus determined still reduce approximately linearly with increasing hole concentration and, most importantly, still reduce to zero at about the same value p=0.19±0.005.

The method may include overdoping the HTSC so that the grain boundary regions between individual grains in the HTSC in particular are doped to maximise the critical current density across grain boundaries. Such grain boundary regions can tend to be underdoped even if the bulk intragranular material is optimally doped or even overdoped (—see Babcock et al (Physica C 227, 183 (1994)). The pseudogap will often be locally present in the grain boundary regions, the effective superconducting order parameter thus locally reduced, and the grains weakly linked. Additionally, impurities tend to accumulate at the grain boundaries. HTSC have a d-wave order parameter which is very sensitive to the presence of impurities $T_c$ being rapidly suppressed at a rate $dT_c/dy$ that depends strongly on doping state. In the underdoped grain boundary regions $T_c$, the order parameter and the condensation energy are all much more rapidly suppressed due to impurity scattering than in the bulk intragranular material. Impurities in underdoped grain boundaries are therefore especially deleterious. Thus while the intragranular $J_c$ may be high, the intergranular $J_c$ may be low due to the underdoped state of the grain boundary regions.

The method of the invention may be used in producing HTSC as bulk materials, wires, tapes or other conductor elements, or thick or thin films for example.

BRIEF DESCRIPTION OF THE FIGURES

The invention is further described with reference to the accompanying figures wherein.

DETAILED DESCRIPTION

Figure 1:
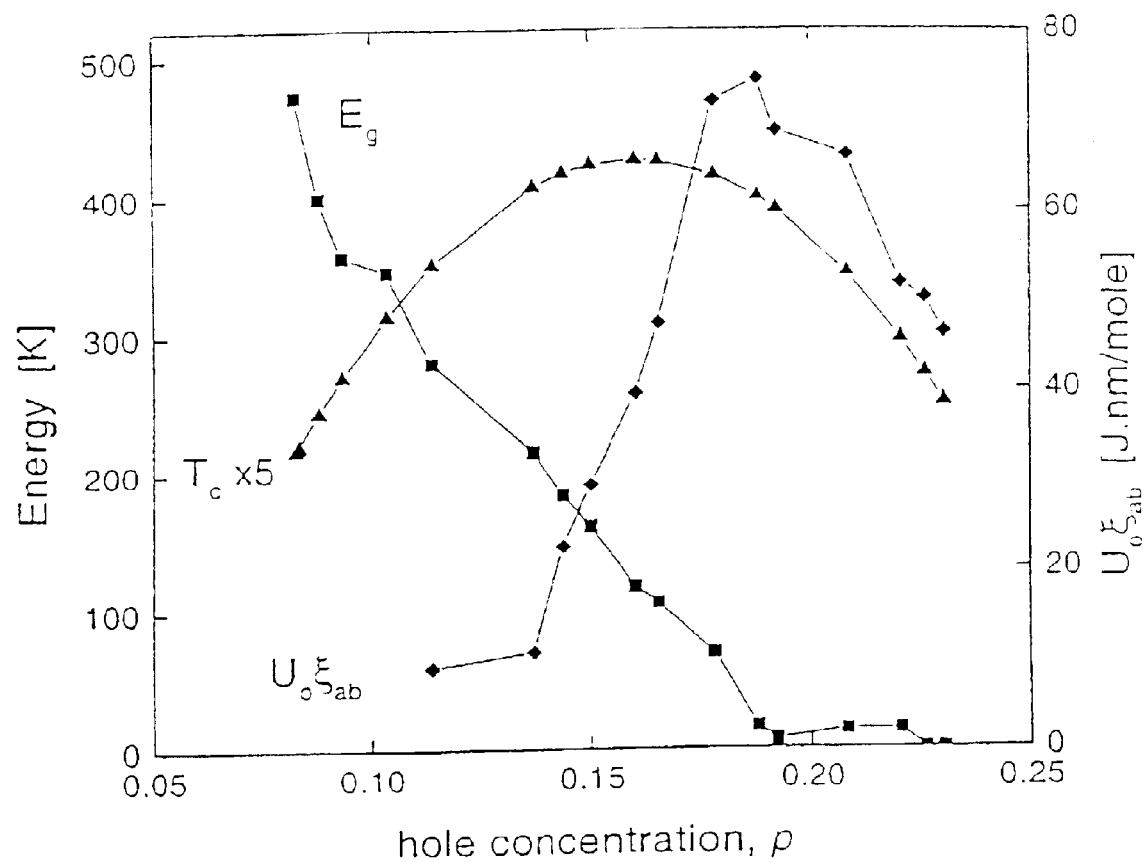
FIG. 1 is a plot for $Y_{0.8}Ca_{0.2}Ba_2Cu_3O_{7-\delta}$ of the hole concentration dependence of $T_c$, the pseudogap energy $E_g$ and the product $U_o\xi_{ab}$ where $\xi_{ab}$ is the ab-plane coherence length.

In the method of the invention the doping state or hole concentration is controlled or adjusted in producing the HTSC to maximise flux pinning and critical current density, to lie at or near a critical overdoped hole concentration (herein: critical doping) at which the normal-state pseudogap is minimised or disappears, and as a consequence the superconducting condensation energy sharply maximises and the London penetration depth, $\lambda_L$, sharply minimises. The critical hole concentration may be determined by use of the thermoelectric power, the temperature dependence of the resistivity, Raman measurements of the frequencies of certain phonon modes or by suitable annealing at elevated temperature in an oxygen-containing atmosphere previously determined to result in the critical doping state, or from the ratio of $T_c/T_{c,max}$ where $T_{c,max}$ is the maximum $T_c$ observed in the superconducting phase curve $T_c(p)$, estimated to occur at about p=0.16. The doping state or hole concentration of the HTSC may be controlled or adjusted by cation substitution, or by increasing the oxygen content of the material beyond that which gives maximum $T_c$, or a combination of both.

Cation substitution to achieve critical doping may be by altervalent substitution such as substitution of $Ca^{2+}$, $Li^+$, $Na^+$ or $K^+$ for $R^{3+}$ in 123, 247 and 124 material; $Li^+$, $Na^+$ or $K^+$ for $Ba^{2+}$ in 123, 247 and 124 materials; $R^{3+}$ for $Ca^{2+}$ in Bi-2212, Tl-2212, Tl-1212 or Hg-1212; $Pb^{2+}$ for $Bi^{3+}$ in Bi-2212 and Bi-2223; and $Pb^{4+}$ for $Tl^{-3+}$ in Tl-1212 and Tl-2212. The compound $Tl_{0.5}Pb_{0.5}Sr_2CaCu_2O_7$ for example has a fixed stoichiometric oxygen content so cannot be adjusted to critical doping by changing the oxygen content. As prepared, this compound is overdoped with $T_c=79K$ and an estimated hole concentration p=0.215, and it is known that by substitution of 0.2–0.25 Y on the Ca site or 0.2–0.25 La on the Sr site then the doping state may be reduced to optimal doping p=0.16 where $T_c$, is maximised to 105–107K. In accordance with the invention preferably 0.12±0.04 Y is substituted for Ca or 0.12±0.04La for Sr in this compound to achieve critical doping. Other rare earth elements may be utilised in the same way in this and other HTSC compounds, noting that small rare earth elements should preferably be substituted for Ca and the larger rare earth elements preferably for Sr. Combined substitution on both the Sr and Ca sites may of course be utilised. Quite generally $Li^+$ substitution in any HTSC material is suitable for increasing the hole concentration of that material.

Oxygenation to achieve critical doping may be achieved by conventional annealing in an oxygen-containing atmosphere or by titration using electrochemical means. Achieving the oxygen content required for critical doping in any HTSC may require the use of oxygen pressures in excess of 1 atmosphere or lower annealing temperatures than otherwise conventionally used to form the HTSC. Depending upon density of the HTSC such annealing may take many days to equilibrate and it may be more convenient to use higher oxygen pressures at higher temperatures where the kinetics of oxygen uptake is faster, or a combination of cation substitution with oxygenation such complete oxygenation is not required. The altervalent substitution of cations tends to alter the oxygen content. Thus the substitution of $Ca^{2+}$ for $R^{3+}$ results in larger oxygen deficiency (larger δ) relative to the unsubsituted compound for the same annealing conditions. This larger oxygen deficiency can be eliminated by lower temperature oxygen annealing. Thus while full oxygenation of $YBa_2Cu_3O_{7-\delta}$ might be achieved by annealing at 380° C. in oxygen, full oxygenation of $Y_{1-x}Ca_xBa_2Cu_3O_{7-\delta}$ (x=0.2 for example) requires lower temperatures 300–350° C. for example. Such low temperatures require longer annealing time. The same considerations apply to R-247.

The HTSC material may be a Bi—Sr—Ca—Cu—O based material such as Bi-2212, which is of nominal composition $Bi_2Sr_2CaCu_2O_{8+\delta}$ where $0 \leq \delta \leq 0.35$, or Bi-2223, which is of nominal composition $Bi_2Sr_2Ca_2Cu_3O_{10+\delta}$ where $0 \leq \delta \leq 0.35$ (where Bi may be partially substituted by Pb, Hg, Re, Os, Ru, Tl, V, Cr, Zr, Nb, Mo, Hf, Ta, W, Co or Sm, Sr may be partially substituted by Ba or a larger lanthanide rare earth element, and Ca may be partially substituted by Y or a lanthanide rare earth element for example, and in these chemical formulae it is also recognised in the art that small variations in stoichiometry are common in such oxide materials). In Bi-2212 and Bi-2223 Bi is commonly partially replaced by Pb, such that Bi may be $Bi_{1-z}Pb_z$ where $0 \leq z \leq 0.3$. Especially preferred compounds include $Bi_{2+e}Sr_2CaCu_2O_{8+\delta}$, $Bi_{2+x+e}Sr_{2-x-y}Ca_{1+y}Cu_2O_{8+\delta}$, $Bi_{2+e}Sr_2Ca_2Cu_3O_{10+\delta}$ and $Bi_{2+x+e}Sr_{2-x}Ca_2Cu_3O_{10+\delta}$ where $0<(e$ and x and $\pm y) \leq 0.4$, and $Bi_{1.9}Pb_{0.2}Sr_{1.9}Ca_1Cu_2O_{8+\delta}$. The doping state of Bi-2212 and Bi-2223 may be varied by cation substitution (which increases the hole concentration p) R for Ca in Bi-2212 where R is Y or any lanthanide rare earth element, or Bi in Bi-2212 and Bi-2223 for example or by varying $\delta$. For $Bi_{1.9}Pb_{0.2}Sr_{1.9}Ca_1Cu_2O_{8+\delta}$, for example $\delta$ may be fixed by annealing the HTSC at about (570±15)° C. in an oxygen partial pressure of 0.1 bar or at a combination of temperature and oxygen partial pressure giving the same value of $\delta$. Only a small $\delta$ variability is possible in Bi-2223, which allows only minor changes in hole concentration. Bi-2212 may be substantially overdoped by full oxygenation to p≈0.22 or 0.225 whereas B-2223 may only be doped to p≈0.17 or at most 0.18. Bi-2223 material may alternatively be prepared to incorporate intergrowths of Bi-2212 in Bi-2223. Intergrowths of Bi-2212 in Bi-2223 increase the doping state of the latter. Such hole-doping intergrowths can be introduced by substituting very small amounts (<1% and preferably <0.1%) of Y or a lanthanide rare-earth element on the Ca site. In preferred forms $Bi_{1.8}Pb_{0.3}Sr_{1.9}Ca_2Cu_3O_{10+\delta}$ may incorporate intergrowths of $Bi_{1.8}Pb_{0.3}Sr_{1.9}CaCu_2O_{8+\delta}$; $Bi_{1.75}Pb_{0.35}Sr_{1.9}Ca_2Cu_{3.04}O_{10+\delta}$ may incorporate intergrowths of $Bi_{1.75}Pb_{0.35}Sr_{1.9}CaCu_2O_{8+\delta}$; $Bi_{1.73}Pb_{0.34}Sr_{1.9}Ca_{1.99}Cu_{3.04}O_{10+67}$ may incorporate intergrowths of $B_{1.73}Pb_{0.34}Sr_{1.9}CaCu_2O_{8+\delta}$; $Bi_{1.88}Pb_{0.23}Sr_{1.96}Ca_{1.95}Cu_{2.98}O_{10+\delta}$ may incorporate intergrowth of composition $Bi_{1.88}Pb_{0.23}Sr_{1.96}CaCu_2O_{8+\delta}$; and $Bi_{1.84}Pb_{0.28}Sr_{1.93}Ca_{1.98}Cu_{2.96}O_{10+\delta}$ may incorporate intergrowths of composition $Bi_{1.84}Pb_{0.28}Sr_{1.93}CaCu_2O_{8+\delta}$.

The HTSC may be an R—Ba—Ca—CuO based HTSC such as the material R-123, which is of nominal composition $RBa_2Cu_3O_{7-\delta}$ where R is Y or a lanthanide rare earth element or a combination thereof and $0 \leq \delta \leq 0.5$, (and R may be partially substituted by Ca, and Ba may be partially substituted by Sr, La or Nd for example, arid it is also recognised in the art that small variations in stoichiometry are common in such oxide materials). Critical doping is preferably achieved by oxygenation to $\delta \leq 0.05$, optionally combined with cation substitution, of Ca, Li, Na or K for R, or Li, Na, or K for Ba for example. Critical doping is achieved very close to the point $\delta=0$ for R=Y, and $\delta$ close to but >0 for a small rare earth such as Tl or Lu. Preferably where R is a larger rare earth element small amounts of Ca are substituted for R so to achieve critical doping. For larger rare earth elements it may not be possible to reach the critical doping state by merely reducing $\delta$ towards zero. This is partly because some R resides on the Ba site where R is a large rare earth element but even if suitable processing to avert such substitution is utilised the charge transfer from CuO chains to $CuO_2$ planes is insufficient to achieve critical doping. Preferred compounds are $R_{1-x}Ca_xBa_2Cu_3O_{7-\delta}$ where $0 \leq x \leq 0.35$ and $0 \leq \delta \leq 0.5$ and $R_{1-x}Li_xBa_2Cu_3O_{7-\delta}$ where $0 \leq x \leq 0.35$ and $0 \leq \delta \leq 0.5$ and wherein x and $\delta$ are jointly adjusted so that the copper oxygen planes are critically doped as described above. Preferably $\delta$ is as small as possible commensurate with critical doping. Thus in this preferred form a value of x is chosen, typically $x \leq 0.1$ such that critical doping is achieved for $\delta \leq 0.10$. It is more preferable that $x \leq 0.05$ and $\delta \leq 0.03$.

The HTSC may be R-247, which is of nominal composition $R_{2-x}Ca_xBa_4Cu_7O_{15-\delta}$ where R is Y or a lanthanide rare earth element or a combination thereof and $0 \leq \delta \leq 0.5$ (and R may be partially substituted by Ca, and Ba may be partially substituted by Sr, La or Nd for example, and it is also recognised in the art that small variations in stoichiometry are common in such oxide materials). Critical doping is preferably achieved by oxygenation to $\delta \leq 0.05$, optionally combined with cation substitution, of Ca, Li, Na or K for R, or Li, Na, or K for Ba for example. Preferred compounds are $R_{2-x}Ca_xBa_4Cu_7O_{15-\delta}$ where $0 \leq x \leq 0.35$ and $0 \leq \delta \leq 0.5$ and $R_{2-x}Li_xBa_4Cu_7O_{15-\delta}$ where $0 \leq x \leq 0.35$ and $0 \leq \delta \leq 0.5$ and wherein x and $\delta$ are jointly adjusted so that the copper oxygen planes are critically doped as described above. Preferably $\delta$ is as small as possible commensurate with critical doping. Thus in this preferred form a value of x is chosen, typically $x \leq 0.1$ such that critical doping is achieved for $\delta \leq 0.10$. It is more preferable that $x \leq 0.05$ and $\delta \leq 0.03$. Because 247 is typically underdoped relative to the equivalent 123 materials the magnitude of Ca content given by x will be required to be greater than in the equivalent 123 materials. A small rare earth such as Tl or Lu is desirable in that a higher Ca content may be achieved than for the larger rare earth elements.

The HTSC may be R-124, which is of nominal composition $RBa_2Cu_4O_8$ where R is Y or a lanthanide rare earth element and $0 \leq \delta \leq 0.35$ (and R may be partially substituted by Ca and Ba may be partially substituted by Sr, La or Nd for example, and it is also recognised in the art that small variations in stoichiometry are common in such oxide materials). Critical doping is achieved by cation substitution, of Ca, Li, Na or K for R, or Li, Na, or K for Ba for example. Preferred compounds are $R_{1-x}Ca_xBa_2Cu_4O_8$ and $R_1$_xLixBa_2Cu_4O_8$ where $0x \leq 0.35$. Because 124 is typically even more underdoped relative to the equivalent 247 and 123 materials a higher level of cation substitution is required than in the equivalent 247 and 123 materials. A small rare earth such as Tl or Lu is desirable to achieve the higher Ca content required.

The HTSC material may be a Tl—Sr—Ca—Cu—O based material such as Tl-1201, which is of nominal composition $TlSr_2CuO_{5+\delta}$, or Tl-1212, which is of nominal composition $TlSr_2CaCu_2O_{7+\delta}$, or Tl-1223 which is of nominal composition $TlSr_2Ca_2Cu_3O_{8+\delta}$ (and where Tl may be partially substituted by Pb, Sr may be partially substituted by La or Ba, and Ca may be partially substituted by R, for example, and in these chemical formulae it is also recognised in the art that small variations in stoichiometry are common in such oxide materials). Preferred compounds are $Tl_{0.5}Pb_{0.5}Sr_{2-w}Ba_wCaCu_2O_7$, $Tl_{0.5}Pb_{0.5}Sr_{2-x}La_xCaCu_2O_7$, and $Tl_{0.5}Pb_{0.5}Sr_2Ca_{1-y}R_yCu_2O_7$ where $0 \leq (x$ and $w) \leq 2$, $0 \leq y \leq 1$ and R is Y or any of the lanthanide rare earth elements, or more generally $(Tl,Pb,Bi)_1(Sr,Ba,La)_2(Ca,R)_1Cu_2O_7$, and $Tl_{0.5}Pb_{0.5}Sr_{2-x}Ca_xCa_2Cu_3O_9$ and $Tl_{0.5}Pb_{0.5}Sr_{2-w-x}Ba_wCa_xCa_2Cu_3O_9$, where $0 \leq x$, $w \leq 1$ or more generally $(Tl,Pb,Bi)_1(Sr,Ba,La)_2Ca_2Cu_3O_9$, where $-0.3 \leq \delta 0.3$.

The HTSC may also be a mercury-based HTSC such as Hg-1212, which is of nominal composition $HgBa_2CaCuO_{6+\delta}$, or Hg-1223 which is of nominal composition $HgBa_2Ca_2Cu_3O_{6+\delta}$ (and where Hg may be partially substituted by Tl, Bi, Pb or Cd, and Ba may be partially substituted by Sr for example, and in these chemical formulae it is also recognised in the art that small variations in stoichiometry are common in such oxide materials).

The critically-adjusted doping state may be quantitatively defined by the HTSC having an overdoped $T_c$ satisfying $0.91T_{c,max} \leq T_c \leq 0.96T_{c,max}$ more preferably $0.92T_{c,max}T_c \leq 0.95T_{c,max}$ and most preferably $T_c = (0.93 \pm 0.005)T_{c,max}$.

The critically-adjusted doping state may be quantitatively defined by the HTSC having an overdoped $T_c$ with the room temperature thermoelectric power $Q(T_{RT})$ in units of $\mu V/K$ satisfying $-4 < Q(T_{RT}) < -1$ and more preferably $-3 < Q(T_{RT}) < -2$ where $280\ K < T_{RT} < 300\ K$.

The critically-adjusted doping state may be quantitatively defined by the HTSC having an overdoped $T_c$ with the normal-state constant-volume resistivity remaining linear in temperature from 250K down to less than 20K above $T_c$. In a more preferred form the normal-state constant-volume resistivity remains linear in temperature from 500K down to less than 20K above $T_c$.

The critically-adjusted doping state may be quantitatively defined by the HTSC having an overdoped $T_c$ with the temperature derivative of the normal-state constant-volume resistivity remaining constant within $\pm 5\%$ when the temperature is reduced from 250K down to less than 20K above $T_c$, and, more preferably, when the temperature is reduced from 500K down to less than 20K above $T_c$.

The critically-adjusted doping state may be defined by annealing the HTSC in an oxygen-containing atmosphere previously determined to result in a critically overdoped $T_c$ with either $T_c$, thermoelectric power or the normal-state resistivity lying within the above noted preferred margins or with the pseudogap having been critically suppressed to zero as determined by heat capacity, NMR spectroscopy, susceptibility or other means. For example, $Bi_{1.9}Pb_{0.2}Sr_{1.9}CaCu_2O_{8+\delta}$ may be annealed at 570° C. in a mixture of 10% oxygen and 90% nitrogen gases (an oxygen partial pressure of 0.1 bar) to achieve critical over-doping with $T_c=83.7K$ in a system with $T_{c,max}=90.5$ K. This gives a $T_c$ reduction of 7.5%, a hole concentration of p=0.19 and a maximal condensation energy of 1.76 J/g.at as determined by heat capacity measurements. $Y_{0.8}Ca_{0.2}Ba_2Cu_3O_{7-\delta}$ may be annealed at 530° C. in oxygen to achieve critical-overdoping with $T_c=79K$ where $T_{c,max}=85.5K$, that is a 7.6% reduction in $T_c$, an estimated hole concentration of p=0.19 and a maximal condensation energy of 2.5 J/g.at. Other alternative combinations of temperature and oxygen partial pressure to achieve critical doping can be used (such as higher temperature and a consequent higher oxygen partial pressure).

The doping state in any HTSC may be defined by Raman measurement of the frequency of a particular phonon mode, the desired frequency having been previously ascertained from a correlation with one of hole concentration, thermoelectric power, resistivity, oxygen annealing or $T_c$ value. One such mode is the 630 $cm^{-2}$ $A_{1g}$ mode.

In R-123 as well as achieving the required degree of oxygenation it is necessary to achieve ordering of the oxygens into chains with a minimum of vacancies on the chains so as to ensure sufficient charge transfer to the $CuO_2$ planes. Because oxygen disordering occurs for $T \geq 50°$ C. it is ideally necessary to slow cool from the annealing temperature to room temperature so as to allow oxygen ordering on the chains and thus complete charge transfer and maximal doping. Moreover, such defect-free CuO chains contribute additionally to the superfluid density and thus further increase $J_c$.

In order to achieve optimal doping in grain boundaries the bulk material may be overdoped so that the grain boundary regions between individual grains in the HTSC are doped to maximise critical current density in the grain boundary regions of the HTSC in particular, even at some sacrifice maximal intragranular critical current density in order to maximise intergranular currents. In contrast to the bulk, cation solubility and oxygen activity will be different in grain boundaries. If for example $Ca^{2+}$ substitution is preferred in grain boundaries relative to the bulk then there is some prospect of critically doping both the grain boundaries and the bulk simultaneously. If $Ca^{2+}$ substitution is preferred in the bulk relative to the grain boundaries then a compromise, as discussed above, may be necessary. Because of the site disorder in grain boundaries the energy wells for oxygen occupancy will not be as deep as in the bulk and as a consequence, lower temperatures (and/or higher oxygen pressures) may be required to oxygenate the grain boundaries than is required to oxygenate the bulk. Annealing temperatures as low as 100° C. to 200° C. may be required to adequately oxygenate the grain boundaries to achieve critical doping therein. While at such low temperatures oxygen diffusion will be prohibitively slow within the bulk, grain boundary diffusion rates will be much higher due to the disorder therein thus making critical oxygenation of grain boundaries below 300° C. or even below 300° C. entirely practicable.

The method of the invention may be used in forming HTS materials into long-length flexible wires or tapes by the technique known in the art as powder-in-tube processing. This technique is especially used in the case of Bi-2212 or Bi-2223 materials. Powders of these materials or precursors to these materials are packed into a metallic tube, often made of silver metal or silver alloy, then by a process of deformation and heat treatment the tube is drawn out into a long wire and the oxide reacted to form a highly textured Bi-2223, for example, HTSC core. The wire may be rebundled once or many times to form a multifilamentary wire. Metallic alloy precursors may also be used to form such long wires and by heat treatment and deformation the metallic alloys are converted to oxides and reacted to form a highly-textured Bi-2223, for example, HTSC core. Other techniques such as coating or melt processing may also be used to form long-length wires or tapes. The materials may also be formed as thin films using any process as is known in the art or as bulk melt-processed single-domain or near-single-domain monolithic bodies.

EXAMPLES

The invention is further illustrated by the following examples:

Example 1

Samples of $Y_{0.8}Ca_{0.2}Ba_2Cu_3O_{7-\delta}$ were investigated as a function of oxygen deficiency, $\delta$, using heat capacity, $C_p$, and NMR spectroscopy. This HTS material is especially useful because its doping state may be altered from heavily underdoped to heavily overdoped as $\delta$ is altered from 1 to 0. The hole concentration was determined using the thermoelectric power correlation between Q(290) and p (Tallon et al., U.S. Pat. No. 5,619,141). The values were found to agree well with values determined from the parabolic relationship between $T_c$ and p $T_c(p)=T_{c,max}[-82.6 (p-0.16)^2]$ and also from estimates of p using bond valence sums from neutron diffraction refinement of atomic coordinates. $T_{c,max}$ is the maximum in the approximately parabolic hole-concentration dependence of $T_c(p)$. The pseudogap energy, $E_g$, was determined from fitting the temperature dependence of the entropy and values were confirmed by fitting the temperature dependent $^{89}Y$ NMR Knight shifts. Both $T_c$ and $E_g$ are plotted in FIG. 1 as functions of p. $E_g$ is seen to fall progressively with increasing doping and reaches zero at about p=0.19 i.e. on the overdoped side and about 0.03 holes per copper higher than the optimal concentration for which $T_c$ is maximised. Alternatively $E_g$ reaches zero when $T_c$ has fallen 7.4% below $T_{c,max}$ on the overdoped side. The condensation energy $U_o$ was determined by intergrating the entropy S(T) from T=0 to T=$T_c$ between the normal state curve $S_{NS}(T)$ and the superconducting curve $S_{SC}(T)$. $U_o$ is found to maximise very sharply at the point p=0.19 where $E_g$ reaches zero. The product $U_o\xi_{ab}$ does not peak quite as sharply but the data plotted in FIG. 1 shows that it stills passes through a rather sharp peak, again maximising at the point where $E_g \to 0$. As a consequence flux pinning and critical currents will also sharply maximise at this point. Most notably the value of $U_o\xi_{ab}$ at optimum doping for maximal $T_c$ is about 39 J.nm/mole while it is nearly double that value (76 J.nm/mole) at critical doping where $E_g \to 0$. Such a large increase for such a small decrease (6K) in $T_c$ is most unexpected and hitherto unknown and offers great benefit for maximising critical currents with little loss in $T_c$ value. For other HTSC materials the $T_c$ reduction will be proportionally the same so that for Bi-2223 a reduction of $T_c$ from $T_{c,max}$=110 K to 103 or 102 K on the overdoped side is not a serious reduction in $T_c$ when cooled to liquid nitrogen temperature yet potentially affords a doubling of flux pinning.

Example 2

Figure 2:
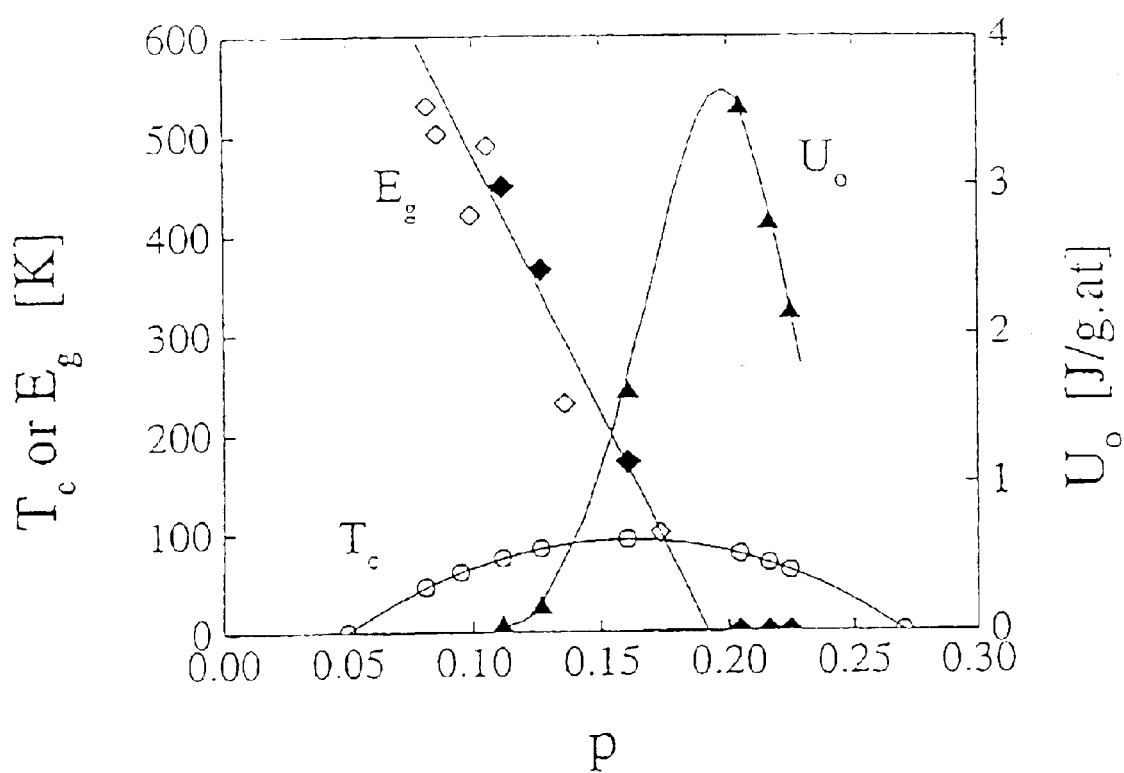
FIG. 2 is a plot of the hole concentration dependence of $T_c$, $E_g$ and $U_o$ for $Bi_2Sr_2CaCu_2O_{8+\delta}$.

Samples of overdoped $Bi_2Sr_2CaCu_2O_{8+\delta}$ with different δ and underdoped $Bi_2Sr_2Ca_{0.7}Y_{0.3}Cu_2O_{8+\delta}$ with different δ were substituted with a range of Co on the Cu site. From the rate of impurity depression of $T_c$, $dT_c/dy$, due to the fraction y of Co one may determine the value of the value of $\gamma=C_p/T$ at T=$T_c$. Using scaling relations (Tallon, Phys. Rev. B-58, R5956 (1998) one may thence determine $E_g$ and $U_o$ which are plotted in FIG. 2 by the filled symbols. The open triangles are the values of $E_g$ determined for $Y_{0.8}Ca_{0.2}Ba_2Cu_3O_{7-\delta}$ from NMR measurements and these show that the two methods give comparable results for $E_g$. Again one may see that for $Bi_2Sr_2CaCu_2O_{8+\delta}$, as in $Y_{0.8}Ca_{0.2}Ba_2Cu_3O_{7-\delta}$, $U_o$ passes through an unexpectedly sharp maximum in the lightly overdoped region where $E_g$ becomes zero. Again $U_o$ approximately doubles on progressing from optimal doping to critical doping. This data for Bi-2212 is confirmed by direct heat capacity measurements. It is believed that the maximising of $U_o$ and $U_o\xi$ at critical doping where $E_g$ becomes zero is a universal behaviour amongst the HTSC materials as has been confirmed in $La_{2-x}Sr_xCuO_4$ and in $Tl_{0.5}Pb_{0.5}Sr_2Ca_{1-x}Y_xCu_2O_7$. It is thus reasonable that this behaviour is also common to the thallium-based and mercury-based HTSC.

Example 3

Figure 3:
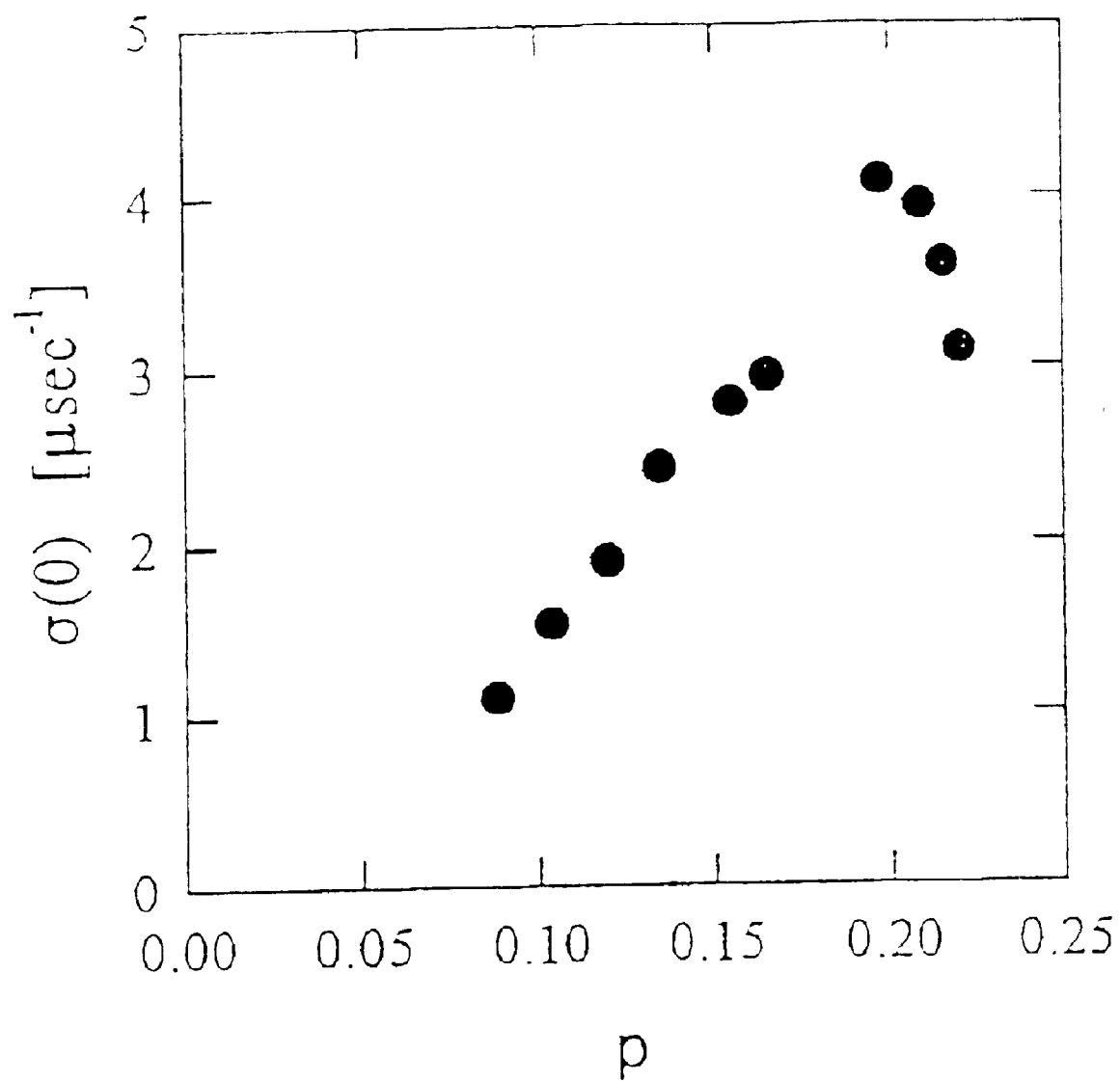
FIG. 3 is a plot of the hole concentration dependence of $\lambda_L^{-2}$ for $Y_{0.8}Ca_{0.2}Ba_2Cu_3O_{7-\delta}$.

Samples of $Y_{0.8}Ca_{0.2}Ba_2Cu_3O_7\delta$ were investigated as a function of oxygen deficiency, δ, using muon spin relaxation. The muon spin relaxation rate at T=0, $\sigma_o$, is proportional to $\lambda_L^{-2}$. FIG. 3 shows a plot of $\lambda_L^{-2}$ as a function of hole concentration, P. $\lambda_L^{-2}$. may be seen to pass through a sharp maximum at the critical point p≈0.19 where $E_g$ becomes zero. $\lambda_L^{-2}$ is a key parameter in determining the magnitude of the irreversibility field. As a consequence critical doping at p≈0.19 not only sharply maximises flux pinning but will result in high irreversibility fields.

Example 4

Figure 4:
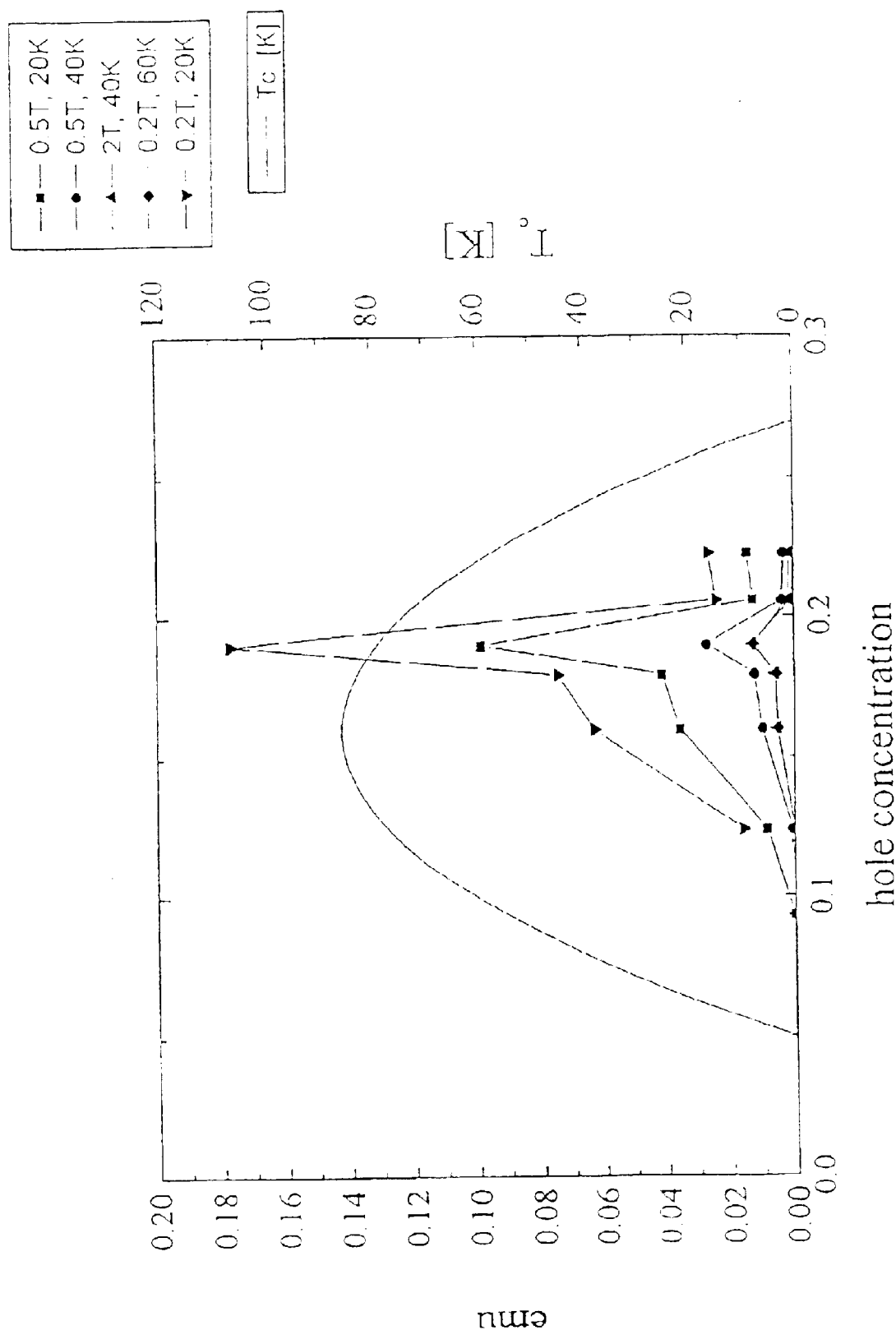
FIG. 4 is a plot of the p-dependence of the magnetisation (proportional to the critical current) of $YBa_2Cu_3O_{7-\delta}$ grain aligned in epoxy. Data is shown for different field strengths and temperatures as shown. The parabolic curve is $T_c$ plotted as a function of p.
Figure 5:
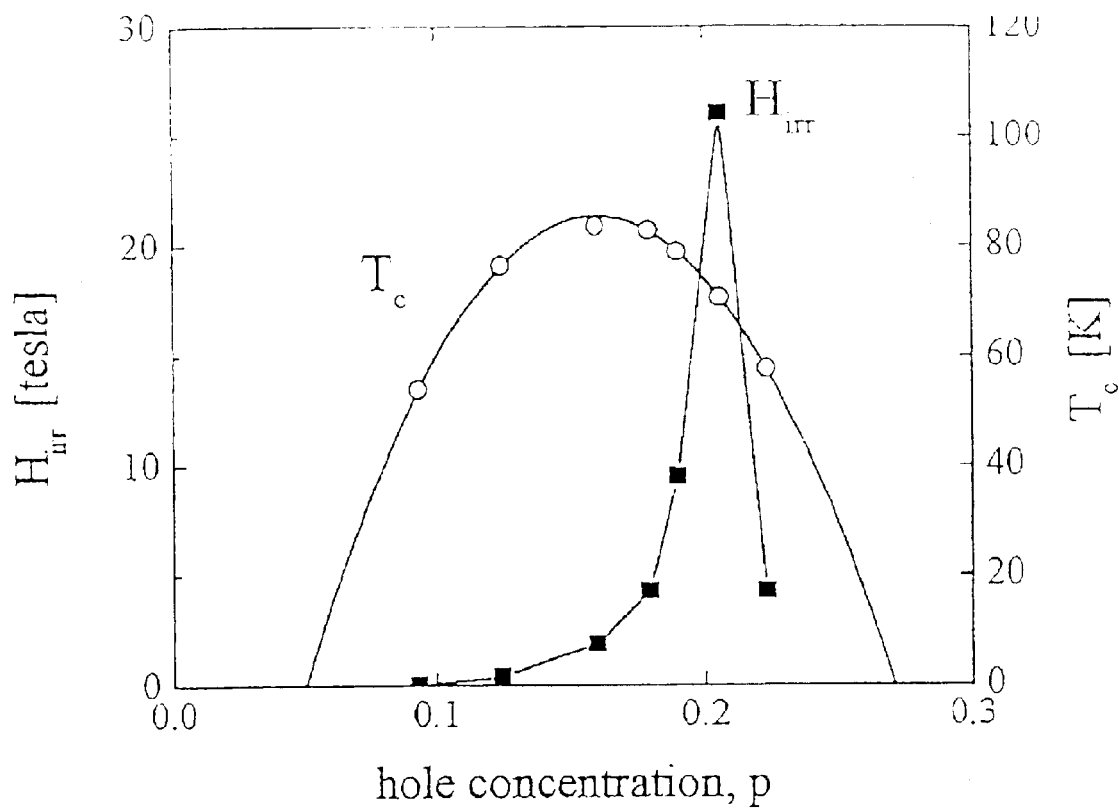
FIG. 5 is a plot of the p-dependence of the irreversibility field at $T=0.75T_c$ for $Y_{0.8}Ca_{0.2}Ba_2Cu_3O_{7-\delta}$ grain-aligned in epoxy. The parabolic curve is $T_c$ plotted as a function of hole concentration, p.

Seven pellets of $Y_{0.8}Ca_{0.2}Ba_2Cu_3O_{7-\delta}$ were synthesized and annealed under various temperatures and oxygen partial pressures then quenched into liquid nitrogen to freeze in the equilibrium oxygen content. Thus 7 samples with different values of oxygen deficiency δ were obtained which accordingly have 7 different hole concentrations spanning the range $0.09 \leq p \leq 0.23$. These pellets were each ground to a very fine powder with a mortar and pestle using isopropyl alcohol as a lubricant and milling for a period of 1 hour. The powder was then suspended in isopropyl alcohol and settled for a period of 30 minutes and the fluid with the remaining suspension was drawn off and dried by evaporation. In this way the large particles were settled out and the remaining particles were of size $\leq 5$ μm. These small particles were well mixed with epoxy. The mixture was then placed in rubber moulds and mounted in an electromagnet to align the particles with c-axes parallel to the field while the epoxy set. The aligning field was approximately 1 tesla. After setting the alignment was confirmed by x-ray diffraction which showed primarily c-axis reflections on the face normal to the aligning field. Small samples were cut from each of the 7 aligned samples and their magnetisation was determined as a function of field strength and temperature using a vibrating-sample magnetometer. FIG. 4 shows a plot of the magnetisation in units of emu as a function of p for measurements at $0.2T_c$, 0.5T and 2T as well as at temperatures of 20K, 40K and 60K. The data can be seen to pass through a sharp maximum at the critical doping doping concentration of p=0.19. For reference the parabolic curve of $T_c$ as a function of p is also plotted to show that the sharp maximum occurs in the lightly overdoped state. This parabolic curve is calculated using the formula $T_c=T_{c,max}[1-82.6(p-0.16)^2]$ which well describes $T_c(p)$ for many of the HTS cuprates, and probably all. The criticality of doping is very evident in this plot, especially at low temperature. The irreversibility line H*(T) was also determined for each sample at T=$0.75T_c$ and is plotted in FIG. 5. Here H* is also seen to pass through a sharp maximum but the maximum occurs beyond critical doping because H* is governed by the product $\lambda_{ab}^{-2} \cdot \lambda_c^{-2}$ where $\lambda_{ab}$ is the in-plane penetration depth and $\lambda_c$ is the c-axis penetration depth. $\lambda_{ab}^{-2}$ is proportional to the superfluid density which $\propto U_o$ and hence passes through a sharp maximum at critical doping. On the other hand $\lambda_c \propto \rho_c$, the c-axis resistivity which monotonically decreases with doping, p. Thus the maximum in irreversibility field occurs beyond critical doping just as shown in FIG. 5. However it is to be noted that because in FIG. 5 T=$0.75T_c$ this data is not for fixed temperature. For conditions of fixed temperature (and fixed field) critical current maximises at critical doping. It is further to be noted that in the samples of this example all grains are separated from each other. The currents are all intragranular currents and do not reflect on grain boundary currents.

Example 5

Figure 6:
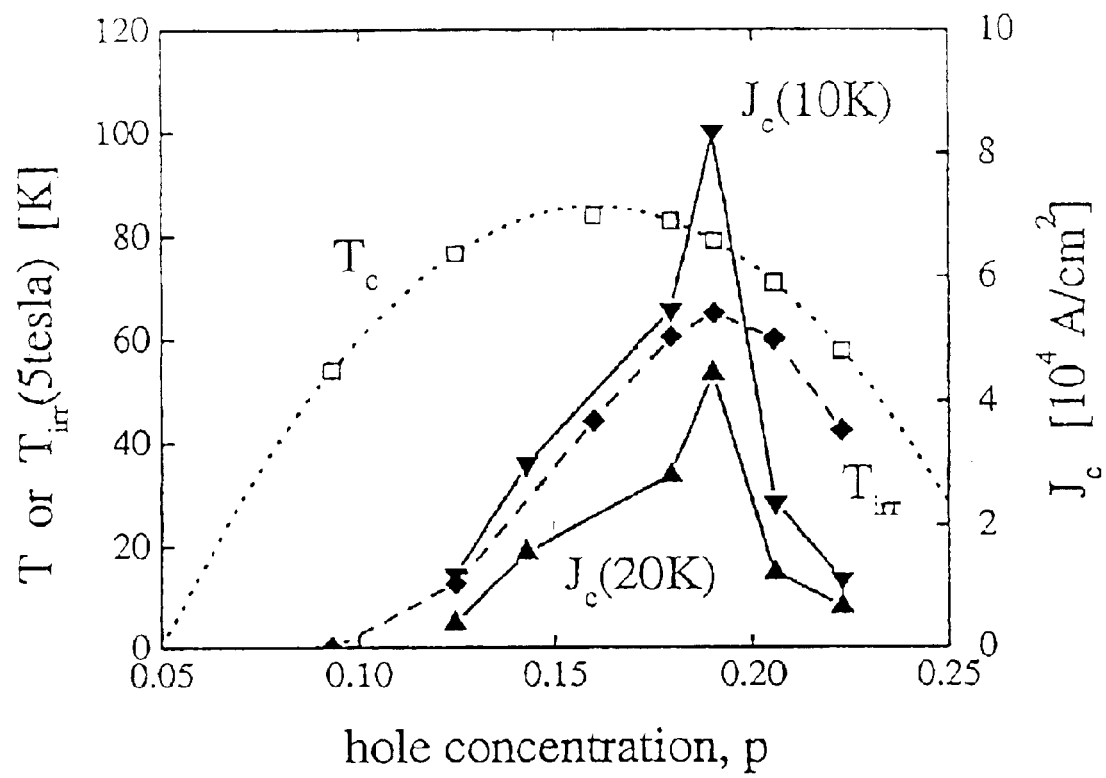
FIG. 6 is a plot of the p-dependence of the magnetisation critical current density in 0.2 Tesla at 10K and 20K as well as the irreversibility temperature at 5 Tesla for $Y_{0.8}Ca_{0.2}Ba_2Cu_3O_{7-\delta}$ grain-aligned in epoxy. The parabolic curve is $T_c$, plotted as a function of hole concentration, p.

The samples of Example 4 were examined in a scanning electron microscope to determine the distribution of particle sizes. The total mass in each sample was then determined by pyrolising off the epoxy. The magnetisation data of Example 4 was then converted to critical current density, $J_c$, using the well-known method of the Bean formula. The thus obtained $J_c$ values for an applied field of 0.2 Tesla and at temperatures of 10K and 20K are plotted as a function of hole concentration, p, in FIG. 6. The irreversibility temperature, $T_{irr}$, at 5 Tesla is also plotted in the figure together with the p-dependence of transition temperature, $T_c$. Both $J_c$ and $T_{irr}$ are seen to maximise close to the critical doping state p=0.19 and well beyond the point p=0.16 where $T_c$ maximises.

Example 6

Samples of $Tl_{0.5}Pb_{0.5}Sr_2Ca_{1-x}Y_xCu_2O_7$ and $Tl_{0.5}Pb_{0.5}Sr_{2-y}La_yCaCu_2O_7$ with x=0, 0.05, 0.1, 0.2, 0.3 and 0.4, and y=0, 0.05, 0.1, 0.2, 0.25, 0.3 and 0.4 were synthesized by solid-state reaction of pellets in oxygen at 1060° C. of a stoichiometric mixture of the oxides of Tl, Pb, Y, La and Cu and the carbonates of Ca and Sr. The precursor materials were first reacted without the $Tl_2O_3$ which was then added for a further reaction at 1060° C. The reacted material was ground and resintered under the same conditions. A small excess (5%) of $Tl_2O_3$ was used because of the volatility of this material and the pellets were sealed in a gold tube under oxygen by crimping the ends. Samples were then investigated by measuring the resistivity, ac susceptibility and heat capacity. When x or y=0 the materials are overdoped and increasing x or y results in decreasing hole concentration. $T_c$ values were found to follow an approximately parabolic dependence upon the amount of substituted Y or rare-earth element passing through a maximum of $T_{c,max}$=107 K when x=0.25. The jump in heat capacity however passed through a sharp maximum when x=0.15. This corresponds to the critical-doping point. The jump in heat capacity at the superconducting transition is directly related to the condensation energy and hence to the flux pinning. Similar results are obtained for $Tl_{0.5}Pb_{0.5}Sr_{2-y}La_yCaCu_2O_7$. Thus, again, properties relating to critical currents are found in these materials to maximise in the lightly overdoped region at critical doping and not at optimal doping where $T_c$ passes through a maximum.

What is claimed is:

1. A high temperature superconducting cuprate material (HTSC) having a doping state or hole concentration higher than the doping state or hole concentration of the material for maximum superconducting transition temperature ($T_c$) and at about a value where the normal-state pseudogap for the material reduces to a minimum and which maximises the critical current density ($J_c$) of the material.

2. An HTSC according to claim 1 in which, the hole concentration p of the material is in the range $0.18 \leq p \leq 0.20$.

3. An HTSC according to claim 2 wherein the hole concentration p is about 0.19.

4. An HTSC according to claim 2 wherein the hole concentration p=0.91±0.005.

5. An HTSC according to claim 2 having a $T_c$ in the range $0.91 T_{c,max} \leq T_c \leq 0.96 T_{c,max}$ where $T_{c,max}$ is the maximum value taken by $T_c$ in its variation with hole concentration.

6. An HTSC according to claim 5 wherein $T_c$ is in the range $0.92T_{c,max} \leq T \leq 0.95T_{c,max}$.

7. An HTSC according to claim 5 wherein $T_{c,max}$=(0.93±0.005)$T_{c,max}$.

8. An HTSC according to claim 2 wherein the room-temperature thermoelectric power $Q(T_{RT})$ for the HTSC is in the range of $4<Q(T_{RT})<-1$ where the units of $Q(T_{RT})$ are $\mu V/K$, where room temperature, $T_{RT}$, lies in the range $280K<T_{RT}<300K$.

9. An HTSC according to claim 8 wherein the thermoelectric power $Q(T_{RT})$ for the HTSC is in the range $-3<Q(T_{RT})<-2$.

10. An HTSC according to claim 2 wherein the temperature derivative of the normal-state resistivity of the HTSC remains constant within ±5% when the temperature is reduced from 250K down to less than 20K above $T_c$.

11. An HTSC according to claim 2 wherein the temperature derivative of the normal-state constant-volume resistivity of the HTSC remains constant within ±5% when the temperature is reduced from 500K down to less than 20K above $T_c$.

12. An HTSC according to claim 2 which is overdoped so that the doping state or hole concentration of the material in the grain boundary regions between individual grains in the HTSC is at about said value which maximises critical current density of the material.

13. Wires, tapes, thin films, coated conductors, bulk materials or any other conductor comprising or containing the materials of claims 1 to 12.

14. A method for preparing a high temperature superconducting cuprate material (HTSC) to maximise the critical current density ($J_c$) thereof, comprising the step of controlling the doping state or hole concentration of the material to be higher than the doping state or hole concentration of the material that provides a maximum superconducting transition temperature ($T_c$) and to be at a value where normal-state pseudogap reduces to a minimum, to increase the critical current density of the material.

15. A method according to claim 14 comprising the step of controlling the hole concentration p to be in the range $0.18 \leq p \leq 0.20$.

16. A method according to claim 15 comprising the step of controlling the hole concentration p to be about 0.19.

17. A method according to claim 15 comprising the step of controlling the hole concentration p to p=0.19 ±0.005.

18. A method according to claim 15 comprising the step of controlling the hole concentration so that $T_c$ for the HTSC is in the range of $0.91 T_{c,max} \leq T_c \leq 0.96T_{c,max}$ where $T_{c,max}$ is the maximum value taken by $T_c$ in its variation with hole concentration.

19. A method according to claim 18 comprising the step of controlling the hole concentration so that T, is in the range $0.92T_{c,max} \leq T_c \leq 0.95 T_{c,max}$.

20. A method according to claim 18 comprising the step of controlling the hole concentration so that $T_c$=(0.93±0.005)$T_{c,max}$.

21. A method according to claim 15 comprising the step of controlling the hole concentration p so that the room-temperature thermoelectric power $Q(T_{RT})$ for the HTSC is in the range $-4<Q(T_{RT})<-1$ where the units of $Q(T_{RT})$ are $\mu V/K$, where room temperature, $T_{RT}$, is in the range $280K<T_{RT}<300K$.

22. A method according to claim 21 comprising the step of controlling the hole concentration p so that the thermoelectric power $Q(T_{RT})$ for the HTSC is in the range $3<Q(T_{RT})<-2$.

23. A method according to claim 15 comprising the step of controlling the hole concentration so that the temperature derivative of the normal-state resistivity of the HTSC remains constant within ±5% when the temperature is reduced from 250K down to less than 20K above $T_c$.

24. A method according to claim 15 comprising the step of controlling the hole concentration so that the temperature derivative of the normal-state constant-volume resistivity remains constant within ±5% when the temperature is reduced from 500K down to less than 20K above $T_c$.

25. A method according to claim 15 comprising the step of overdoping the HTSC so that the grain boundary regions between individual grains in the HTSC are doped to maximise critical current density.

26. A high temperature superconducting cuprate material prepared by the method of claim 14.

* * * * *